US007153750B2

(12) United States Patent
Chung et al.

(10) Patent No.: US 7,153,750 B2
(45) Date of Patent: Dec. 26, 2006

(54) METHODS OF FORMING CAPACITORS OF SEMICONDUCTOR DEVICES INCLUDING SILICON-GERMANIUM AND METALLIC ELECTRODES

(75) Inventors: Eun-ae Chung, Gyeonggi-do (KR); Ki-hyun Hwang, Gyeonggi-do (KR); Jung-hwan Oh, Gyeonggi-do (KR); Hyo-jung Kim, Gyeonggi-do (KR); Seok-woo Nam, Gyeonggi-do (KR); Won-sik Shin, Seoul (KR); U-in Chung, Seoul (KR); Young-sun Kim, Gyeonggi-do (KR); Hee-seok Kim, Gyeonggi-do (KR); Beom-jun Jin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/823,352

(22) Filed: Apr. 13, 2004

(65) Prior Publication Data

US 2004/0259308 A1 Dec. 23, 2004

(30) Foreign Application Priority Data

Apr. 14, 2003 (KR) ...................... 10-2003-0023331
Apr. 14, 2003 (KR) ...................... 10-2003-0023351

(51) Int. Cl.
*H01L 21/20* (2006.01)

(52) U.S. Cl. .............................. 438/393; 257/E21.008

(58) Field of Classification Search ................ 438/381, 438/386, 393, 396

See application file for complete search history.

(56) References Cited

U.S. PATENT DOCUMENTS 5,930,106 A 7/1999 Deboer et al.
6,150,208 A 11/2000 Deboer et al.
6,180,480 B1 1/2001 Economikos et al.
6,440,811 B1 8/2002 Coolbaugh et al.
6,441,423 B1 8/2002 Mandelman et al.
6,479,854 B1 11/2002 Thakur et al.
6,507,063 B1 * 1/2003 Coolbaugh et al. ......... 257/300
6,511,873 B1 * 1/2003 Ballantine et al. .......... 438/239
6,524,902 B1 * 2/2003 Rhee et al. ................. 438/199
6,541,811 B1 4/2003 Thakur et al.
6,693,016 B1 * 2/2004 Gutsche et al. ............. 438/386

FOREIGN PATENT DOCUMENTS

JP 5-211288 A 8/1993
JP 2002-203947 A 7/2002
KR 2000-0022698 A 4/2000
KR 2002-0050702 A 6/2002

OTHER PUBLICATIONS

Notice to Submit Response, KR App. No. 10-2003-0023331, Dec. 23, 2004.

Notice to Submit Response (with English language translation), KR App. No. 10-2003-0023331, Apr. 28, 2005.

* cited by examiner

*Primary Examiner*—Scott B. Geyer
(74) *Attorney, Agent, or Firm*—Myers Bigel Sibley & Sajovec, P.A.

(57) ABSTRACT

A capacitor of a semiconductor device includes a cylinder type capacitor lower electrode, a dielectric layer, and an upper electrode. The upper electrode includes a metallic layer on the dielectric layer and a doped poly$Si_{1-x}Ge_x$ layer stacked on the metallic layer. Methods of forming these capacitors also are provided.

21 Claims, 8 Drawing Sheets

METHODS OF FORMING CAPACITORS OF SEMICONDUCTOR DEVICES INCLUDING SILICON-GERMANIUM AND METALLIC ELECTRODES

RELATED APPLICATION

This application claims the benefit of Korean Patent Application Nos. 2003-0023331 and 2003-0023351, filed Apr. 14, 2003, the disclosures of which are hereby incorporated herein by reference in their entireties as if set forth fully herein.

FIELD OF THE INVENTION

The present invention relates to semiconductor devices and methods of fabricating the same, and more particularly, to capacitors which can be used in semiconductor devices, and methods of fabricating the same.

BACKGROUND OF THE INVENTION

Capacitors are widely used in many integrated circuit semiconductor devices. For example, capacitors are used to store data in Dynamic Random Access Memory (DRAM) devices. As is well known to those having skill in the art, an integrated circuit capacitor includes a first, lower or bottom electrode, a second, top or upper electrode, and a dielectric layer therebetween.

As semiconductor devices become more highly integrated, the cell size of a DRAM may decrease along with the effective area of a lower electrode of a cell capacitor. However, a predetermined amount of cell capacitance may be desirable. In order to obtain desired cell capacitance in a narrow area, a high dielectric layer formed of a material, such as $Al_2O_3$ and $Al_2O_3/HfO_2$, having a dielectric constant several to several hundred times greater than a dielectric constant of an oxide/nitride/oxide (ONO) layer, may be used as a capacitor dielectric layer.

It is known to use doped polysilicon as the upper and/or lower electrodes. However, a doped polysilicon electrode used as upper and/or lower electrodes of a capacitor may react with a high dielectric layer and may deteriorate the electrical performance of the capacitor. In order to potentially solve this problem, a low dielectric layer, such as an SiON layer, may be provided between the doped polysilicon electrode and the high dielectric layer. However, the low dielectric layer may cause an increase in the overall thickness of the dielectric layer.

It is also known to use a metallic layer having a lower reactivity level than a polysilicon layer for an upper electrode of a capacitor using a high dielectric layer or for both the upper and lower electrodes of the capacitor. The metallic layer may include a layer formed of conductive oxide or conductive nitride of a metallic material as well as a layer formed of the metallic material. Thus, in addition to a semiconductor-insulator-semiconductor (SIS) capacitor using a doped polysilicon electrode as upper and/or lower electrodes, it is known to provide a metal-insulator-semiconductor (MIS) capacitor and a metal-insulator-metal (MIM) capacitor.

However, problems may occur when wet etching or dry etching an upper electrode formed of a metallic layer. Moreover, due to low resistivity, the upper electrode may not be suitable as a resistor layer for signal delay. As such, it is known to provide a double layer, formed by stacking a doped polysilicon layer on a metallic layer, for the upper electrode. Here, amorphous silicon is deposited on the metallic layer using low pressure chemical vapor deposition (LP CVD) and activation thermal treatment is performed, thereby forming the doped polysilicon layer. Unfortunately, due to the thermal treatment, the leakage current of the upper electrode formed of the double layer may be lower in comparison to the leakage current of the upper electrode formed of only the metallic layer.

FIG. 1 is a graph of voltage versus leakage current showing an increase in leakage current caused by activation thermal treatment performed on a doped polysilicon layer of a conventional MIS capacitor. Graph (a) of FIG. 1 shows the leakage current of an MIS capacitor in which only a TiN layer is used as an upper electrode and which does not use thermal treatment. Graph (b) of FIG. 1 shows the leakage current of an MIS capacitor in which a double layer formed by stacking an n-type doped polysilicon layer on a TiN layer is used as an upper electrode. In graph (b) of FIG. 1, the n-type doped polysilicon layer is deposited on the TiN layer at a temperature of 530° C. using LP CVD, and thermal treatment is performed on the n-type doped polysilicon layer in an $N_2$ atmospheric furnace at a temperature of 600° C. for 30 minutes.

Leakage current is increased, and Tox is thicker in (b) of FIG. 1 in which activation thermal treatment is performed. Thus, it may be desirable to provide a process with a low thermal budget which can replace conventional thermal treatment conditions (such as furnace process conditions of 600° C., 30 minutes or 650° C., 2 minutes) of the n-type doped polysilicon layer.

SUMMARY OF THE INVENTION

According to some embodiments of the present invention, a capacitor of a semiconductor device comprises a capacitor lower electrode on a semiconductor substrate, a dielectric layer on the lower electrode, and an upper electrode on the dielectric layer. The upper electrode comprises a metallic layer on the dielectric layer and a $Sin_{1-x}Ge_x$ layer stacked on the metallic layer. In some embodiments the $Si_{1-x}Ge_x$ layer comprises a doped poly (i.e., polycrystalline) $Si_{1-x}Ge_x$ layer.

According to other embodiments of the present invention, a capacitor of a semiconductor device is fabricated by forming a capacitor lower electrode on a semiconductor substrate. Next, a dielectric layer is formed on the lower electrode. A metallic layer and a $Si_{1-x}Ge_x$ layer are sequentially stacked on the dielectric layer to form an upper electrode comprising the metallic layer and the $Si_{1-x}Ge_x$ layer.

Accordingly, an upper electrode of the capacitor according to some embodiments of the present invention comprises a $Si_{1-x}Ge_x$ layer. According to experimental results, an n-type doped poly$Si_{1-x}Ge_x$ layer can be deposited on a metallic layer or a dielectric layer at a low temperature of less than or about 550° C. in an activated state or can be activated at a temperature of less than or about 550° C. Accordingly, compared to a conventional capacitor process that may be performed at a high temperature of more than 600° C., on an n-type doped polysilicon layer, leakage current can be decreased.

DETAILED DESCRIPTION OF THE INVENTION

Figure 1:
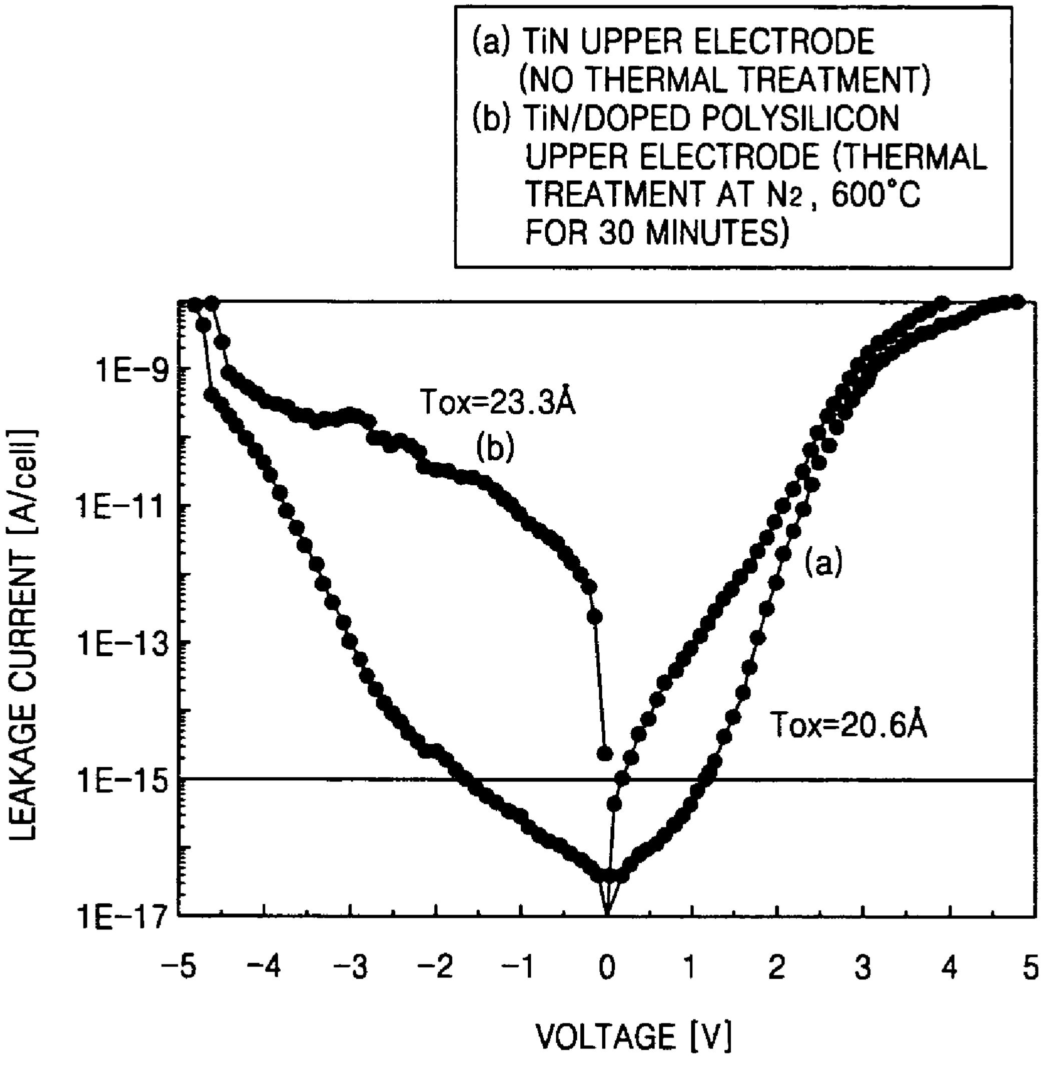
FIG. 1 is a graph of voltage versus leakage current showing an increase in leakage current caused by activation thermal treatment performed on a doped polysilicon layer of a conventional metal-insulator-semiconductor (MIS) capacitor.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout. It will be understood that when an element such as a layer, region or substrate is referred to as being “on” another element, it can be directly on the other element or intervening elements may also be present. Furthermore, relative terms such as “lower” or “upper” may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term “directly” means that there are no intervening elements. As used herein, the term “and/or” includes any and all combinations of one or more of the associated listed items.

It will be understood that, although the terms first, second, etc. may be used herein to describe various embodiments, elements, components, regions, layers and/or sections, these embodiments, elements, components, regions, layers and/or sections should not be limited by these terms. These terms are only used to distinguish one embodiment, element, component, region, layer or section from another region, layer or section. Thus, a first embodiment, region, layer or section discussed below could be termed a second embodiment, region, layer or section, and, similarly, a second embodiment, region, layer or section could be termed a first embodiment, region, layer or section without departing from the teachings of the present invention.

First Embodiments

FIGS. 2 through 7 are cross-sectional views illustrating a capacitor and a method of fabricating the same according to first embodiments of the present invention. Capacitors according to first embodiments of the present invention are MIS capacitors comprising a lower electrode formed of a doped polysilicon layer and an upper electrode formed of a TiN layer and an n-type or a p-type doped poly$Si_{1-x}Ge_x$ layer.

Figure 2:
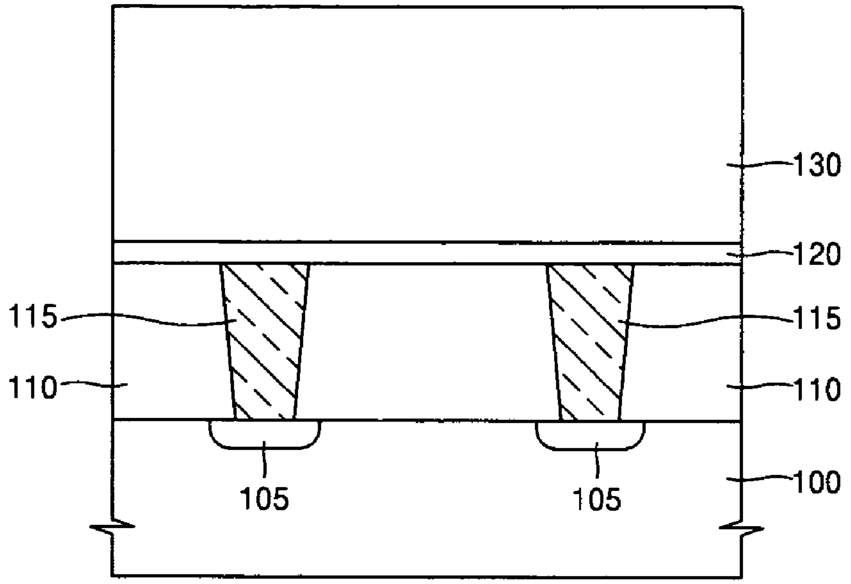
FIGS. 2 through 7 are cross-sectional views illustrating a MIS capacitor and a method of fabricating the same according to first embodiments of the present invention.

Referring to FIG. 2, a lower insulating layer 110 is formed on a semiconductor substrate 100. Then, the lower insulating layer 110 is etched, and a plurality of contact plugs 115 are formed on an impurity region 105 of the semiconductor substrate 100. An etch stopper 120 formed of silicon nitride is formed on the contact plugs 115 and the lower insulating layer 110. Then, boron phosphorus silicate glass (BPSG), phosphorus silicate glass (PSG), plasma enhanced (PE)-tetra ethyl ortho silicate (TEOS), and/or high density plasma (HDP)-oxide is deposited on the etch stopper 120 so that a mold oxide layer 130 is formed.

Figure 3:
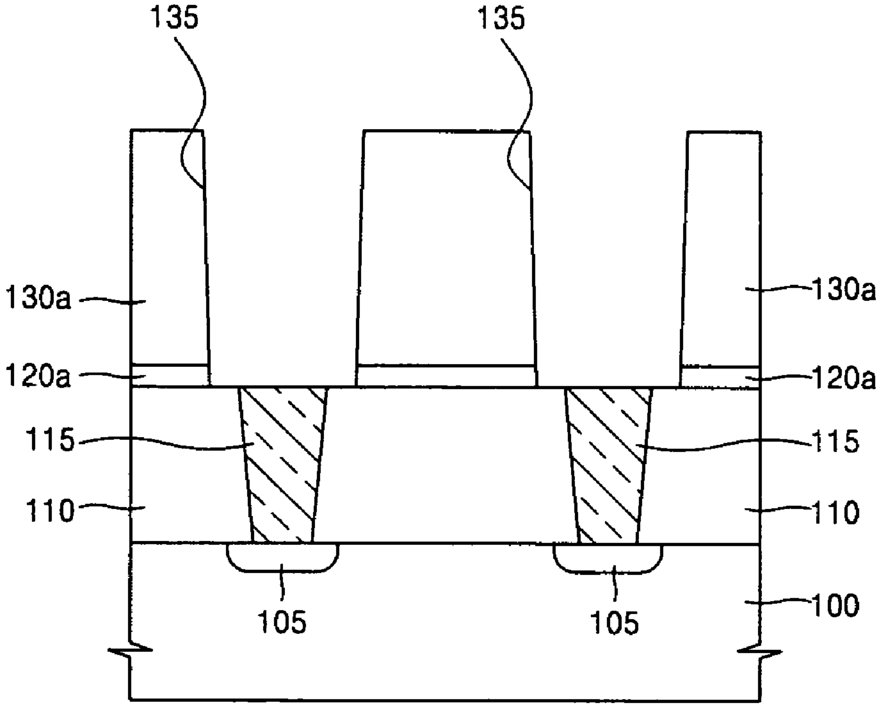

Next, as shown in FIG. 3, the mold oxide layer 130 is etched until the top surface of the etch stopper 120 is exposed so that a mold oxide layer pattern 130a is formed. In this case, the etch stopper 120 protects the lower insulating layer 110 so that the lower insulating layer 110 is not subject to substantial etching. Subsequently, an etching process is performed to remove only the exposed etch stopper 120 so that a hole 135 through which the contact plug 115 and the top surface of the lower insulating layer 110 around the contact plug 115 is exposed, is formed. An etch stopper pattern 120*a* remains in a lower portion of the mold oxide layer pattern 130*a*.

Figure 4:
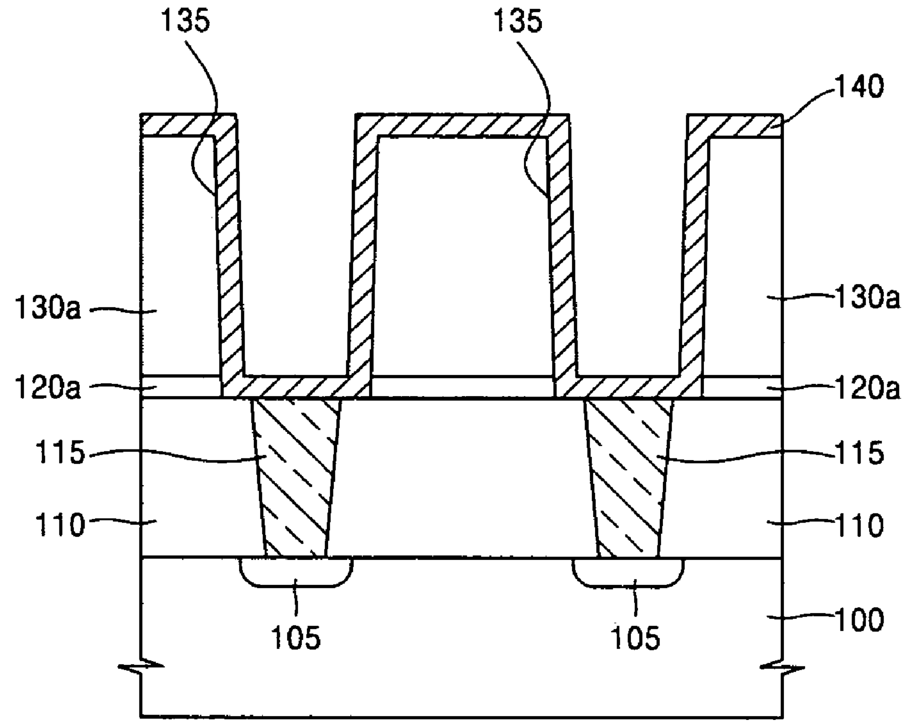

Referring to FIG. 4, a doped polysilicon layer 140 is formed to a thickness in which the hole 135 is not completely filled. The doped polysilicon layer 140 is a layer to be a lower electrode of the capacitor and may be formed using CVD with good step coverage or atomic layer deposition (ALD). For example, polysilicon is deposited on an intermediate structure in which the hole 135 is formed, using LP CVD. Then, in order to decrease resistivity, $PH_3$ doping is performed on the polysilicon so that the polysilicon is n-type doped polysilicon.

Figure 5:
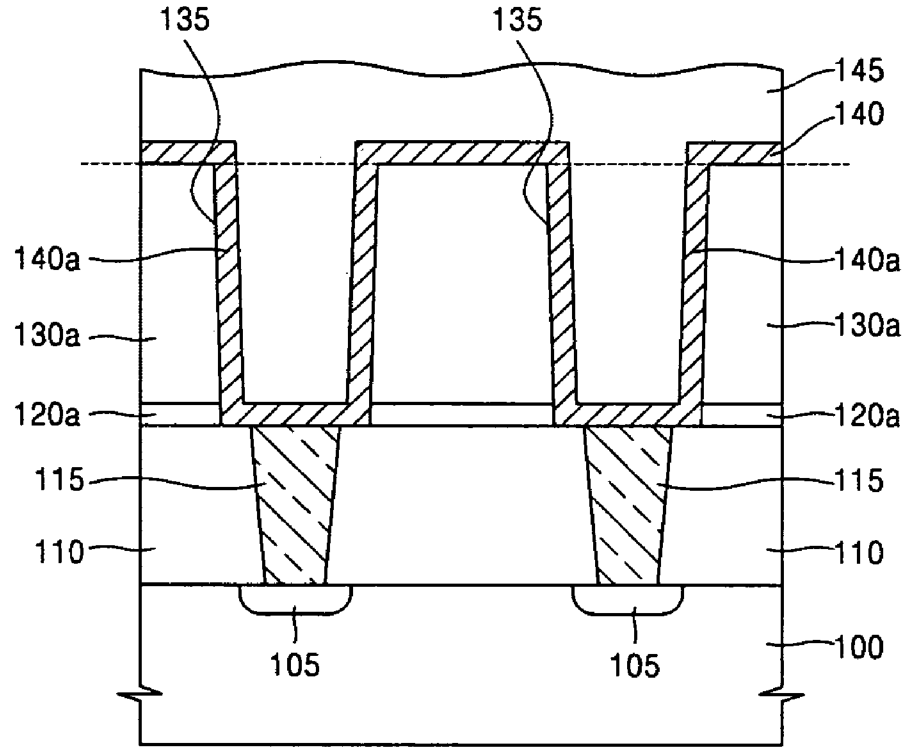

Referring to FIG. 5, a capping layer 145, such as an undoped silicate glass (USG) layer having a good gap-filling characteristic, is deposited on the doped polysilicon layer 140, thereby burying the hole 135. Next, the capping layer 145 and the doped polysilicon layer 140 are removed using an etchback or a chemical mechanical polishing (CMP) process until the top surface of the mold oxide layer pattern 130*a* is exposed (in the drawing, an upper portion based on a dotted line is removed) so that separate cylinder type capacitor lower electrodes 140*a* are formed.

Figure 6:
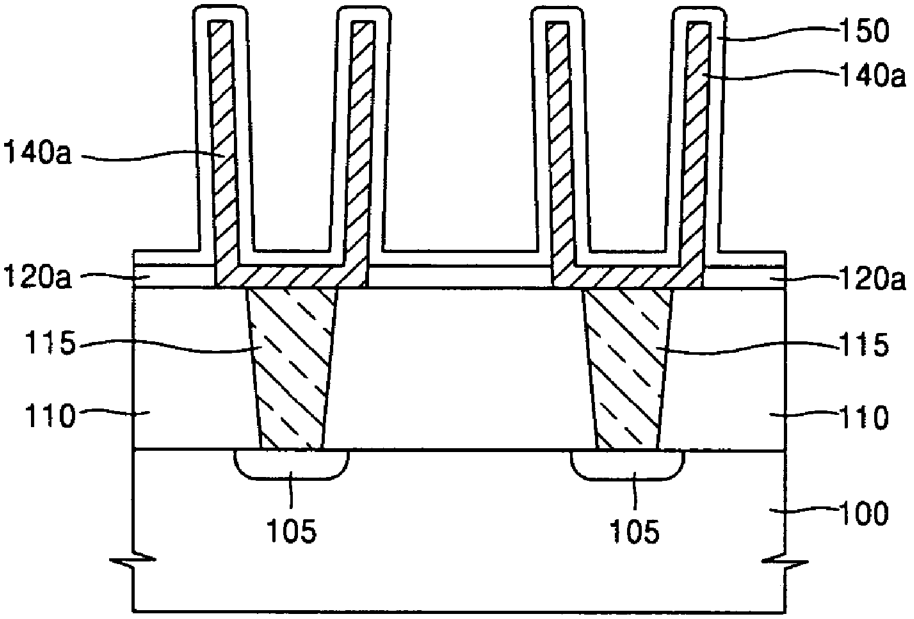

Next, as shown in FIG. 6, the capping layer 145 and the mold oxide layer pattern 130*a* are removed using a wet etching process to expose the surface of the lower electrode 140*a*. Then, a dielectric layer 150 is formed on the surface of the lower electrode 140*a*, remote from the substrate 100. Plasma nitridation or thermal nitridation using a $NH_3$ gas is performed on the surface of the lower electrode 140*a* before forming the dielectric layer 150. As a result, a silicon nitride layer having a thickness of 10–20 Å may be formed on the surface of the lower electrode 140*a*. This reduces, or prevents a reaction that may occur between the lower electrode 140*a* and the dielectric layer 150.

The dielectric layer 150 may be formed of an $HfO_2$ layer, an $Al_2O_3$ layer, or an $Al_2O_3/HfO_2$ composite layer. CVD with step coverage and/or ALD may be used to form the dielectric layer 150. In particular, in the case of ALD, a deposition temperature of the dielectric layer 150 can be maintained to be low at about 300° C. such that ALD may be advantageous for a capacitor process. A step of processing the dielectric layer 150 after depositing the dielectric layer 150 may be further performed so that electrical characteristics of the dielectric layer 150 may be improved. For example, an ozone ($O_3$) treatment, a plasma treatment at a gas atmosphere containing oxygen or nitrogen, and/or a thermal treatment at a gas atmosphere containing oxygen or nitrogen can be performed on an intermediate structure in which the dielectric layer 150 is formed.

Figure 7:
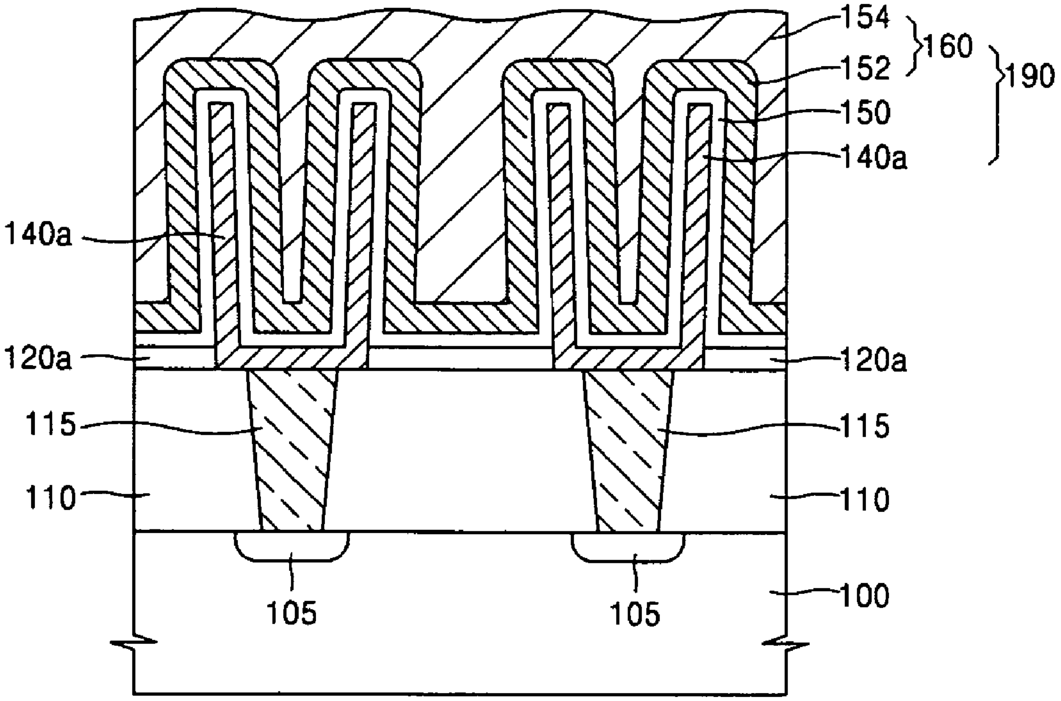

Next, as shown in FIG. 7, an upper electrode 160 is formed on the dielectric layer 150, remote from the lower electrode 140*a*. In this case, a TiN layer 152 and an n-type or a p-type doped poly$Si_{1-x}Ge_x$ layer 154 are sequentially stacked on the dielectric layer 150 so that the upper electrode 160 is formed.

First, the TiN layer 152 may be formed using CVD, ALD and/or metal organic CVD (MO CVD). A WN, TaN, Cu, Al and/or W layer, instead of the TiN layer 152 may be formed. Also, the TiN layer 152 may be formed of noble metals, such as Pt, Ir, Ru, Rh, Os and/or Pd, an oxide layer of the noble metals and/or a composite layer of metallic layers, such as TiN/W, TiN/TaN and/or WN/W. Combinations (including subcombinations) of these materials and layers may be used. The deposition temperature of the layers may be less than 500° C.

Next, the n-type or p-type doped poly$Si_{1-x}Ge_x$ layer 154 is formed on the TiN layer 152. The doped poly$Si_{1-x}Ge_x$ layer 154 may be formed by in situ doping impurities. To this end, furnace type equipment, single wafer type equipment and/or mini-batch equipment in which, for example, 25 wafers are disposed, may be used to perform LP CVD. Two steps of doping impurities after depositing a poly$Si_{1-x}Ge_x$ layer, aside from in situ doping, may be performed.

In some embodiments, an $Si_{1-x}Ge_x$ layer is formed at a temperature of less than or about 550° C., or less than or equal to 550° C., for example, at a temperature of about 400–550° C., and in some embodiments, at about 500° C., using a Silane-based gas, such as $SiH_4$, $Si_2H_6$ and/or $SiH_2Cl_2$, and a gas, such as $GeH_4$ and/or $GeF_4$, as source gases. The $Si_{1-x}Ge_x$ layer may be formed in an amorphous state and may then be polycrystallized during activation thermal treatment. Alternatively, the $Si_{1-x}Ge_x$ layer may be polycrystallized and activated from the start. However, since the $Si_{1-x}Ge_x$ layer is deposited on the TiN layer 152 which is crystalline, the $Si_{1-x}Ge_x$ layer may become crystalline unless the deposition temperature of the $Si_{1-x}Ge_x$ layer is very low. According to experimental results of some embodiments the present invention, the $Si_{1-x}Ge_x$ layer becomes crystalline even at a temperature of about 425° C., for example, at 420° C., so that thermal treatment may not be needed. When the $Si_{1-x}Ge_x$ layer is in an amorphous state, the deposition temperature of the $Si_{1-x}Ge_x$ layer may be lowered to be less than or about 400° C., for example, about 350–400° C., and the thermal treatment temperature of the $Si_{1-x}Ge_x$ layer may be lowered to be less than or about 550° C., for example, about 400–500° C.

An n-type doped poly$Si_{1-x}Ge_x$ layer may be formed by depositing the poly$Si_{1-x}Ge_x$ layer and by in situ doping P and/or As. A p-type doped poly$Si_{1-x}Ge_x$ layer may be formed by doping B. $BCl_3$ and/or $B_2H_6$ may be used as a B doping source. Since doping impurities on the $Si_{1-x}Ge_x$ layer is performed to decrease resistivity, a doping concentration may be determined by considering target resistivity. For example, the doping concentration of an n-type impurity, such as P or As, is $3\times10^{20}/cm^3$, and the doping concentration of a p-type impurity, such as B, may be more than or about $1\times10^{20}/cm^3$. If the deposition temperature of the n-type doped poly$Si_{1-x}Ge_x$ layer is lower than about 400° C., thermal treatment may be performed, and then, doped impurities may be activated. However, the thermal treatment temperature of the n-type doped poly$Si_{1-x}Ge_x$ layer may be less than about 550° C. As such, a capacitor 190 comprising the lower electrode 140*a*, the dielectric layer 150, and the upper electrode 160 is fabricated at a lower temperature of less than about 550° C., in some embodiments of the present invention.

Here, a composition ratio x of Si and Ge may be adjusted by a gas flow ratio. The composition ratio may not be limited to a particular range in some embodiments. However, in some embodiments, the composition ratio may be designed with an impurity concentration so that the work function becomes a value in which at least a depletion layer is not formed. For example, the composition ratio may be about $0.05 \leqq x \leqq 0.9$ when the above-described n-type impurity concentration is used. The composition ratio may be about $0.1 \leqq x \leqq 0.9$ when the above-described p-type impurity concentration is used. In both cases, in some embodiments, the composition ratio is about $0.1 \leqq x \leqq 0.6$. In particular, in some embodiments, the composition ratio may be adjusted to be about x=0.5 when the p-type impurity concentration is used. The composition ratio may be designed in consideration of resistivity, deposition speed, surface morphology, deposition temperature and/or other parameters.

Since the melting point of the $Si_{1-x}Ge_x$ layer is lower than that of silicon, physical phenomena, such as deposition, crystallization, grain growth, and impurity activation, may occur at a temperature lower than silicon. Doped poly$Si_{1-x}Ge_x$, instead of polysilicon may be applied to an upper electrode using this characteristic so that the temperature of the $Si_{1-x}Ge_x$ layer is lowered to be less than or about 550° C. and the leakage current of an MIS capacitor can be decreased.

Second Embodiments

Figure 8:
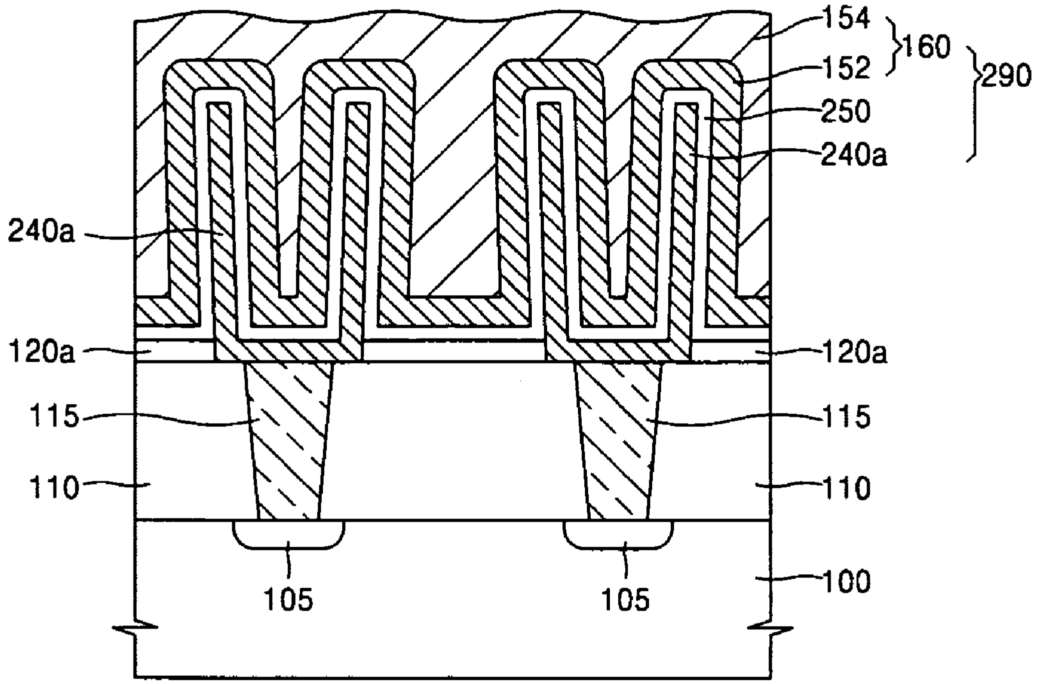
FIG. 8 is a cross-sectional view illustrating a metal-insulator-metal (MIM) capacitor and a method of fabricating the same according to second embodiments of the present invention.

FIG. 8 is a cross-sectional view illustrating capacitors and methods of fabricating the same according to second embodiments of the present invention. For elements in FIG. 8 that are the same as those in the first embodiments, the same reference numerals as those of FIGS. 1 through 7 have been used, and repeated descriptions thereof will be omitted. The second embodiments describe how a doped poly$Si_{1-x}Ge_x$ upper electrode according to the present invention can be applied to an MIM capacitor.

A capacitor 290 comprises a lower electrode 240*a* formed of a metallic layer and an upper electrode 160 comprising a TiN layer 152 and an n-type or a p-type doped poly$Si_{1-x}Ge_x$ layer 154. As in the first embodiments, a TiN, WN, TaN, Cu and/or W layer is deposited on a mold oxide layer pattern using CVD, ALD, or MO CVD and is planarized so that the lower electrode 240*a* is formed. Also, the lower electrode 240*a* may be formed of noble metals, such as Pt, Ir, Ru, Rh, Os and/or Pd, an oxide layer of the noble metals, and/or a metallic multi-layer, such as TiN/W, TiN/TaN and/or WN/W. When these metallic layers are used for the lower electrode 240*a*, an $HfO_2/Al_2O_3$ layer, a $SrTiO_3$ layer and/or (Ba, Sr) $TiO_3$ layer as well as an $HfO_2$ layer, an $Al_2O_3$ layer and/or an $Al_2O_3/HfO_2$ composite layer can be used for a dielectric layer 250.

As in the first embodiments, the doped poly$Si_{1-x}Ge_x$ layer 154, instead of polysilicon is applied to an upper electrode of the MIM capacitor 290 having the above structure such that the temperature of the $Si_{1-x}Ge_x$ layer can be lowered to be less than or about 500° C.

Third Embodiments

Figure 9:
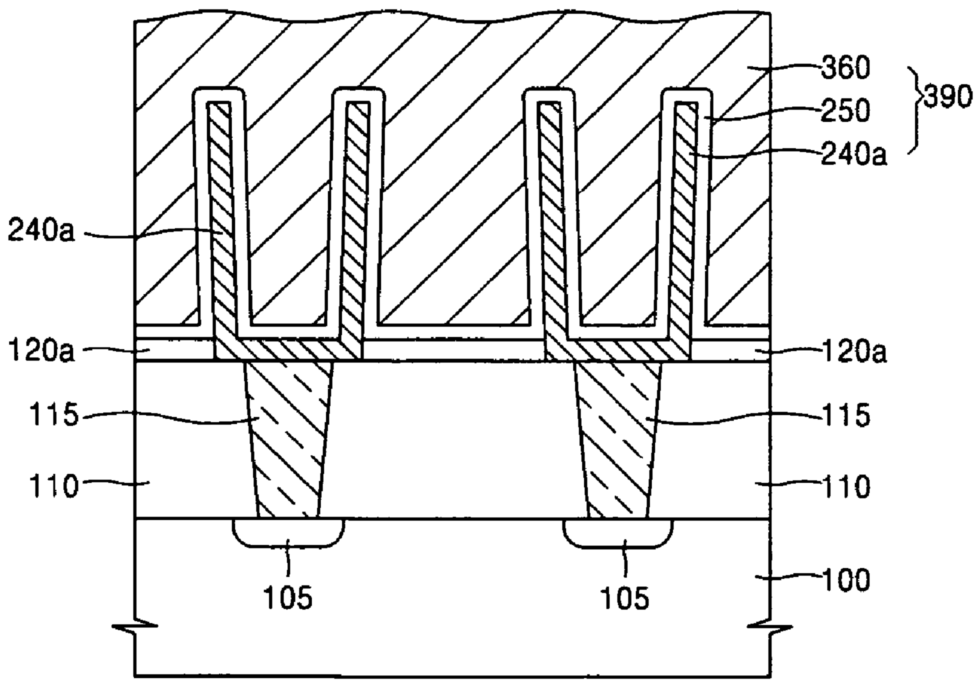
FIG. 9 is a cross-sectional view illustrating an MIM capacitor and a method of fabricating the same according to third embodiments of the present invention.

FIG. 9 is a cross-sectional view illustrating capacitors and methods of fabricating the same according to third embodiments of the present invention. For elements in FIG. 9 that are the same as those in the first and second embodiments, the same reference numerals as those of FIGS. 1 through 8 have been used, and repeated descriptions thereof will be omitted.

As shown in FIG. 9, an upper electrode 360 is formed of a single layer, that is, an n-type or a p-type doped poly$Si_{1-x}Ge_x$ layer. In some embodiments, x of the doped poly$Si_{1-x}Ge_x$ layer ranges such that $0.1 \leqq x \leqq 0.6$.

In this case, a metallic layer may be used for a lower electrode **240*a* of a capacitor 390**. As described in the second embodiments, the metallic layer may be formed of WN, TaN, Cu, Al and/or W as well as TiN, noble metals, such as Pt, Ir, Ru, Rh, Os and/or Pd, an oxide layer of the noble metals, and/or a composite layer of TiN/W, TiN/TaN, or WN/W.

More detailed embodiments of the present invention will be described through the following specific experimental examples. Contents that are not described therein can be inferred by those skilled in the art, and thus, descriptions thereof will be omitted. In addition, the following experimental examples are not intended to limit the present invention.

Experimental Example 1

In order to use a poly$Si_{1-x}Ge_x$ layer as an upper electrode of a capacitor according to some embodiments of the present invention, the poly$Si_{1-x}Ge_x$ layer was deposited on a silicon wafer using single wafer type equipment at 500° C. and under a pressure of 275 torr, while simultaneously performing an in situ P doping process. $SiH_4$ and $GeH_4$ were used as source gases, and the poly$Si_{1-x}Ge_x$ layer was deposited on the silicon wafer for about 4–5 minutes while varying the flow of GeH4. $GeH_4$ was diluted with hydrogen or nitrogen by 10% and supplied (hereinafter, denoted by 10% $GeH_4$). A P doping concentration was $3\times10^{20}/cm^3$, and thermal treatment was not performed on the n-type doped poly$Si_{1-x}Ge_x$ layer which is a resultant structure.

Figure 10:
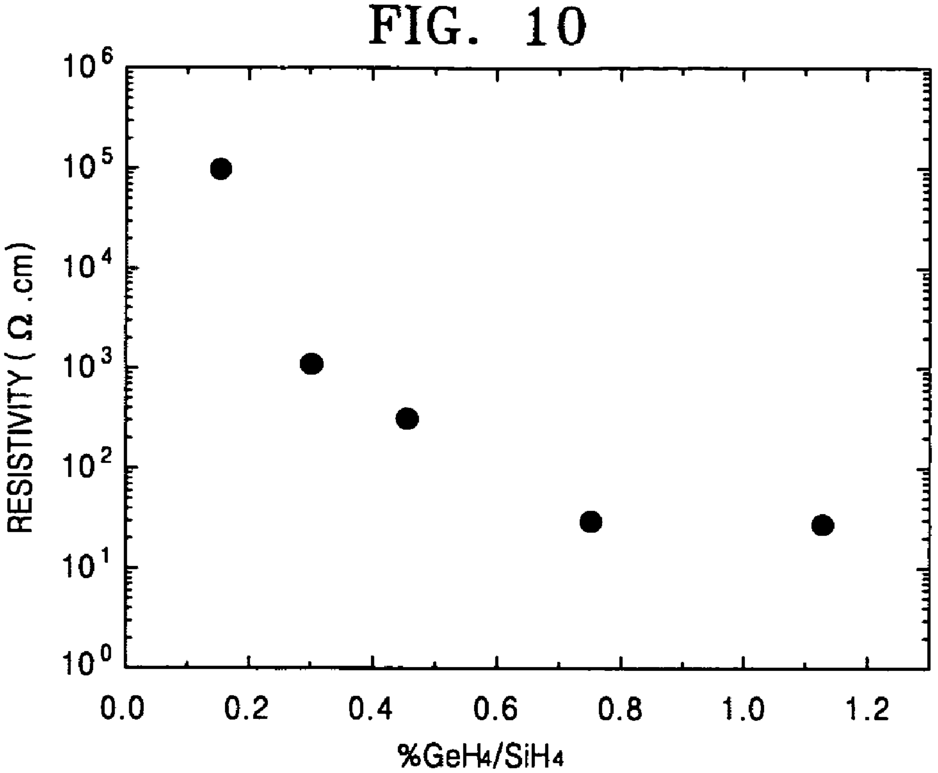
FIG. 10 is a graph of the flow of $GeH_4$ of in situ n-type doped poly$Si_{1-x}Ge_x$ versus resistivity.

FIG. 10 is a graph of the flow of $GeH_4$ of in situ n-type doped poly$Si_{1-x}Ge_x$ versus resistivity. The horizontal axis represents the rate of 10% $GeH_4$:$SiH_4$, and the vertical axis represents resistivity. As shown in FIG. 10, the resistivity of the n-type doped poly$Si_{1-x}Ge_x$ is reduced by the flow of $GeH_4$. It can be understood from the resistivity of FIG. 10 that in situ n-type doped poly$Si_{1-x}Ge_x$ activated simultaneously during deposition was formed on the above-described deposition conditions of 500° C. and 275 torr.

Accordingly, when the deposition conditions of 500° C. and 275 torr in which $SiH_4$ and $GeH_4$ are used as source gases, are used, activation and subsequent thermal treatment can be omitted in some embodiments of the present invention, unlike in a conventional method of fabricating a capacitor. Since a temperature by which the state of silicon can be changed from an amorphous state to polycrystalline during silicon deposition is lowered according to a reduction in pressure, when mini-batch (about 4 torr) or furnace type LP CVD equipment (less than about 1 torr) having pressure lower than that of single wafer type equipment is used, the deposition of the in situ n-type doped poly$Si_{1-x}Ge_x$ can be performed at an even lower temperature.

Experimental Example 2

A cylinder type lower electrode was formed of a polysilicon layer using ALD. Then, $PH_3$ doping was performed so that the polysilicon layer was a doped polysilicon. Plasma nitridation using an $NH_3$ gas was performed on the surface of a doped polysilicon lower electrode at 790° C. at an RF power of 300W for 20 seconds so that a silicon nitride layer having a thickness of 16 Å was formed. A $HfO_2$ layer was formed to a thickness of 45 Å as a dielectric layer on the silicon nitride layer using [Hf(NEtMe)$_4$], called TEMAH, and $O_3$ as a source gas at 300° C. through ALD using Ar bubbling.

Next, a TiN layer was formed on the $HfO_2$ layer at 450° C. using ALD. $TiCl_4$ and $NH_3$ were used as source gases, and a deposition temperature did not exceed 500° C. An in situ n-type doped poly$Si_{1-x}Ge_x$ layer was stacked on the TiN layer under the following conditions so that an upper electrode comprising a TiN layer and the in situ n-type doped poly$Si_{1-x}Ge_x$ layer was formed.

The poly$Si_{1-x}Ge_x$ layer was deposited on the TiN layer using single wafer type equipment at 470° C. and under a pressure of 275 torr so that in situ P doping with a concentration of $3\times10^{20}/cm^3$ was performed. $SiH_4$ and $GeH_4$ were used as source gases, and deposition was performed by two steps of seeding and main deposition.

In the step of seeding, $SiH_4$ was supplied flowing at 50 sccm without $GeH_4$ for 50 seconds. In this case, 1% diluted $PH_3$ (hereinafter, denoted by 1% $PH_3$) as a P doping source was supplied flowing at 6 sccm. The flow of $N_2$ which is a carrier gas, was 9000 sccm. In the step of main deposition, the flow of $SiH_4$ was increased by 80 sccm, and 10% $GeH_4$ was supplied flowing at 240 sccm. The same flow of 1% $PH_3$ and $N_2$ as that in the step of seeding was used. The time taken for the step of main deposition was about 110 seconds. In this case, x was about 0.2. Hydrogen or nitrogen was used to dilute $PH_3$ and $GeH_4$. Thermal treatment was not performed on an n-type poly$Si_{1-x}Ge_x$ layer which is a resultant structure.

Figure 11:
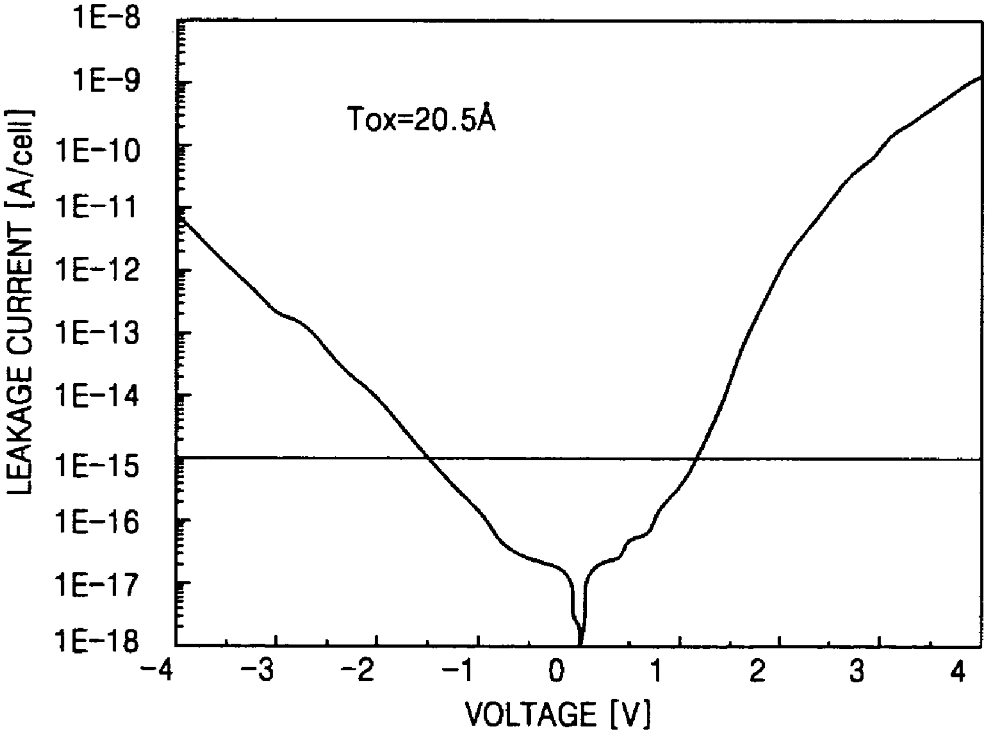
FIG. 11 is a graph of a voltage versus leakage current of an MIS capacitor fabricated according to some embodiments of the present invention.

FIG. 11 is a graph of a voltage versus leakage current of a capacitor fabricated according to some embodiments of the present invention. A leakage current shown in FIG. 11 was much lower than a leakage current shown in (b) of FIG. 1 and was almost similar to that shown in (a) of FIG. 1. Tox was measured at 20.5 Å to be similar to (a) of FIG. 1. Accordingly, the n-type doped poly$Si_{1-x}Ge_x$ layer having a property of an upper electrode was obtained without a thermal treatment.

This result can also be obtained by depositing an in situ P doped poly$Si_{1-x}Ge_x$ layer at 470° C. and under a pressure of 0.45 torr for 65 minutes using an LP CVD furnace.

Experimental Example 3

A capacitor was fabricated under similar conditions to those of the experimental example 2. A variety of results of Tox were obtained by varying deposition conditions of an $HfO_2$ layer. In order to compare this result with the result according to some embodiments of the present invention, as shown in (b) of FIG. 1, a capacitor using a double layer of a TiN layer and an n-type doped polysilicon layer that was thermally treated at 600° C. for 30 minutes, as an upper electrode was fabricated.

Figure 12:
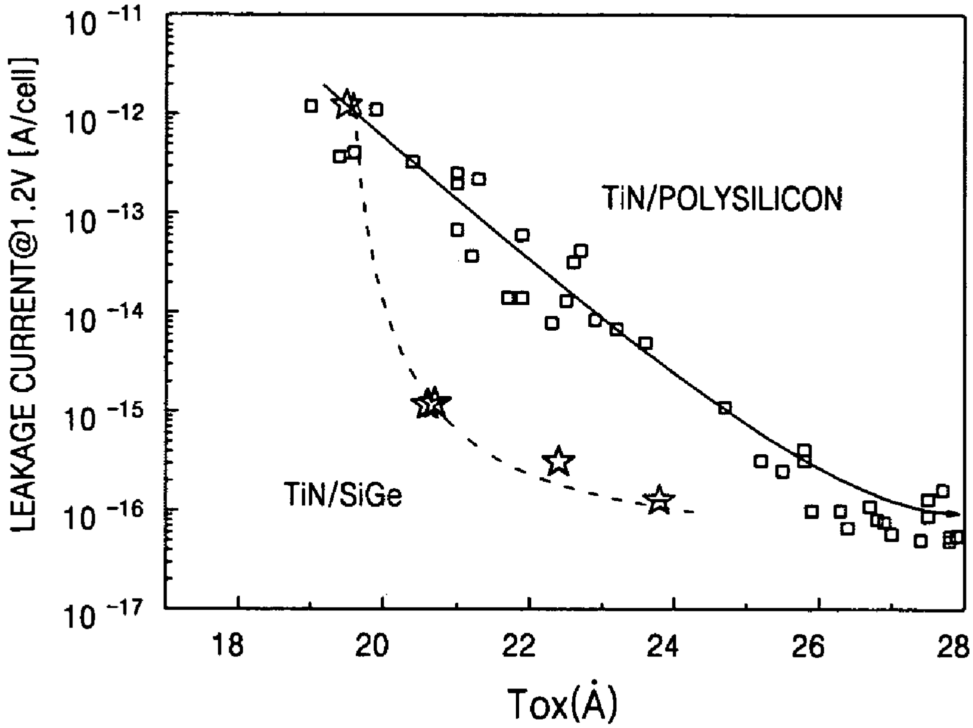
FIG. 12 is a graph of Tox versus leakage current of a conventional MIS capacitor and an MIS capacitor according to some embodiments of the present invention.

FIG. 12 is a graph of Tox versus leakage current at 1.2V of capacitors fabricated according to the present invention. A dotted line of FIG. 12 is the result of the capacitor according to some embodiments the present invention, and a solid line of FIG. 12 is the result of a conventional capacitor shown in (b) of FIG. 1.

As shown in FIG. 12, even under the same Tox conditions, the leakage current of the capacitor according to some embodiments of the present invention is smaller than that of the conventional capacitor. In addition, on the same leakage current conditions, Tox of the capacitor according to some embodiments of the present invention is smaller than that of the conventional capacitor. Accordingly, the leakage current and Tox of the capacitor according to some embodiments of the present invention are smaller than those of the conventional capacitor so that a capacitor having desirable properties can be fabricated.

Experimental Example 4

In order to use an in situ p-type doped poly$Si_{1-x}Ge_x$ layer as an upper electrode of a capacitor according to some embodiments of the present invention, the in situ p-type poly$Si_{1-x}Ge_x$ layer was formed. A poly$Si_{1-x}Ge_x$ layer was deposited on a dielectric layer through LP CVD using furnace type equipment under a pressure of less than about 1 torr and at a temperature of 425° C., while simultaneously performing in situ B doping, thereby forming the in situ p-type doped poly$Si_{1-x}Ge_x$ layer. In this case, $SiH_4$ and $GeH_4$ were used as source gases, and the $BCl_3$ was used as a B doping gas, and a doping concentration was about $1\times10^{21}/cm^3$. x of the poly$Si_{1-x}Ge_x$ layer was both 0.2 and 0.5, that is, compositions of both $Si_{0.8}Ge_{0.2}$ and $Si_{0.5}Ge_{0.5}$ were obtained. In order to compare this result with the result according to some embodiments of the present invention, a conventional n-type doped polysilicon layer was deposited on a dielectric layer at 530° C. $PH_3$ was used as a doping gas, and the doping concentration was about $3\times10^{20}/cm^3$. Activation thermal treatment was not performed on the deposited in situ p-type doped poly$Si_{1-x}Ge_x$ layer and the n-type doped polysilicon layer. Experimental conditions and evaluation data of these layers are summarized in Table 1.

TABLE 1

| | n-type doped polysilicon layer | In situ p-type doped Poly$Si_{0.8}Ge_{0.2}$ layer | In situ p-type doped Poly$Si_{0.5}Ge_{0.5}$ layer |
|---|---|---|---|
| Deposition equipment | LP CVD Furnace type Equipment | LP CVD Furnace type equipment | LP CVD Furnace type equipment |
| Deposition temperature (° C.) | 530 | 425 | 425 |
| Maximum surface resistance(Ω/square) | — | 1955 | 237.8 |
| Minimum surface resistance(Ω/square) | — | 981 | 110.1 |
| Surface resistance (Ω/square) | — | 1547 | 128.0 |

Even though the conventional n-type doped polysilicon layer was deposited at a temperature 105° C. higher than the in situ p-type doped poly$Si_{1-x}Ge_x$ layer according to some embodiments of the present invention, surface resistance was so high that it exceeded a measurement limit. In contrast, an in situ p-type doped poly$Si_{0.8}Ge_{0.2}$ layer and an in situ p-type doped poly$Si_{0.5}Ge_{0.5}$ layer according to some embodiments of the present invention showed lower surface resistance. In particular, even though the $Si_{0.5}Ge_{0.5}$ layer having a larger amount of Ge was deposited at a low temperature of 425° C. and was not thermally treated, surface resistance was about 128Ω/square such that the $Si_{0.5}Ge_{0.5}$ layer was appropriate for an upper electrode of the capacitor.

Experimental Example 5

In order to use a TiN layer as an upper electrode of a capacitor according to some embodiments of the present invention, the TiN layer was deposited on a dielectric layer. Then, a poly$Si_{1-x}Ge_x$ layer was deposited on the TiN layer, while simultaneously performing in situ B doping, so that a p-type doped poly$Si_{1-x}Ge_x$ layer was formed. The poly$Si_{1-x}Ge_x$ layer was deposited using LP CVD using furnace type equipment under a pressure of less than about 1 torr and at a temperature of 425° C. The other conditions were the same as those in the experimental example 4. The only difference is that the in situ p-type doped poly$Si_{1-x}Ge_x$ layer was formed on the TiN layer rather than the dielectric layer. In order to compare this result with the result according to some embodiments of the present invention, a conventional n-type doped polysilicon layer was deposited on the TiN layer at 530° C. Activation thermal treatment was not performed on the in situ p-type doped poly$Si_{1-x}Ge_x$ layer according to some embodiments of the present invention, and activation thermal treatment was performed on the conventional n-type doped polysilicon layer on several conditions. Experimental conditions and evaluation data of these layers are summarized in Table 2.

TABLE 2

| | TiN layer/n-type doped polysilicon layer | TiN layer/in situ p-type doped poly$Si_{0.8}Ge_{0.2}$ layer | TiN layer/in situ p-type doped poly$Si_{0.5}Ge_{0.5}$ layer |
|---|---|---|---|
| Deposition equipment | LP CVD Furnace type equipment | LP CVD Furnace type equipment | LP CVD Furnace type equipment |
| Deposition Temperature (° C.) | 530 | 425 | 425 |
| Deposition speed (Å/min) | 10 | 19 | 27 |

TABLE 2-continued

| | TiN layer/n-type doped polysilicon layer | | | | TiN layer/in situ p-type doped poly$Si_{0.8}Ge_{0.2}$ layer | TIN layer/in situ p-type doped poly$Si_{0.5}Ge_{0.5}$ layer |
|---|---|---|---|---|---|---|
| Deposition time (min) | 180 | | | | 94 | 66 |
| Activation thermal treatment | X | 550° C. 30 min | 580° C. 30 min | 600° C. 10 min | X | X |
| Maximum surface resistance (Ω/square) | 100.5 | 99.6 | 74.2 | 32.8 | 137.9 | 61.9 |
| Minimum surface resistance (Ω/square) | 79.8 | 80.2 | 71 | 31.1 | 112.7 | 57.0 |
| Surface resistance (Ω/square) | 89.5 | 87.3 | 72.4 | 31.9 | 128.0 | 59.8 |

As shown in Table 2, the deposition speed of $Si_{0.8}Ge_{0.2}$ was evaluated at 19 Å/min, and the deposition speed of $Si_{0.5}Ge_{0.5}$ was evaluated at 27Å/min. Accordingly, in order to obtain a layer having a thickness of about 1800 Å, the deposition time of $Si_{0.8}Ge_{0.2}$ was about 94 minutes, and the deposition time of $Si_{0.5}Ge_{0.5}$ was about 66 minutes. Since the deposition speed of conventional doped polysilicon was about 10 Å/min, about 180 minutes would be required to obtain a layer having a similar thickness. Accordingly, according to some embodiments of the present invention, the p-type doped poly$Si_{1-x}Ge_x$ layer is used as an upper electrode such that a process time can be reduced.

In addition, it can be known from the surface resistance evaluation result that even though $Si_{0.5}Ge_{0.5}$ according to some embodiments of the present invention was not activated and thermally treated, a similar result to the result obtained by performing thermal treatment on conventional doped polysilicon at 580° C. for 30 minutes or at 600° C. for 10 minutes can be obtained. Thus, according to some embodiments of the present invention, even when a deposition temperature is 425° C., both deposition and activation can be performed at a time. As a result, the p-type doped poly$Si_{1-x}Ge_x$ layer can be performed at a temperature 105° C. lower than conventional doped polysilicon. Accordingly, according to some embodiments of the present invention, the p-type doped poly$Si_{1-x}Ge_x$ layer can be deposited at a low temperature within a short period of time such that thermal burden on a capacitor is reduced.

Experimental Example 6

Figure 13:
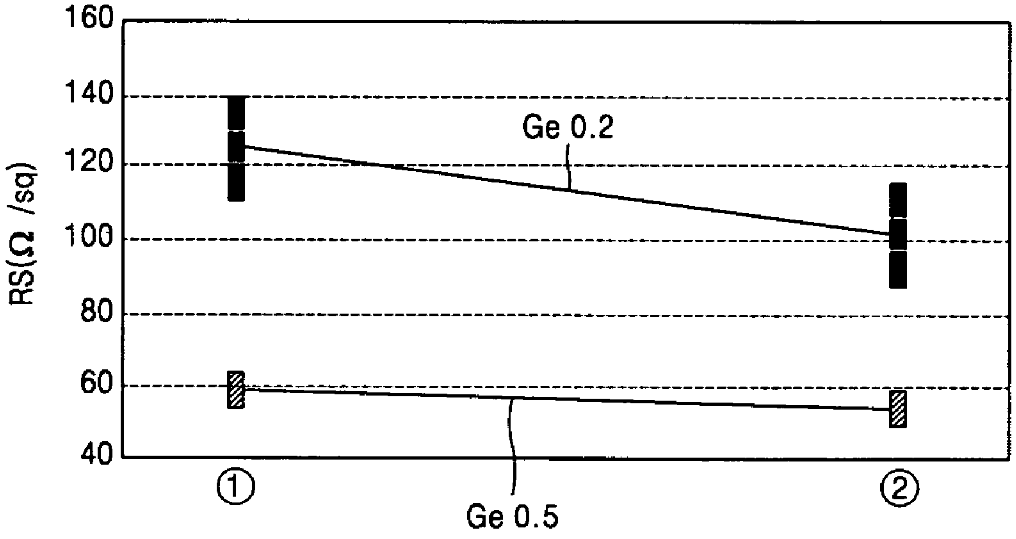
FIG. 13 is a graph showing a variation in resistance when activation thermal treatment is performed on in situ p-type doped poly$Si_{0.8}Ge_{0.2}$ and poly$Si_{0.5}Ge_{0.5}$, which are deposited on a dielectric layer according to some embodiments of the present invention.

FIG. 13 is a graph showing a variation in resistance when activation thermal treatment is performed on in situ p-type doped poly$Si_{0.8}Ge_{0.2}$ and poly$Si_{0.5}Ge_{0.5}$, which are deposited in the above manner. A horizontal axis of FIG. 13 represents activation thermal treatment, and a vertical axis of FIG. 13 represents surface resistance. ① represents an as-deposited state, and ② represents a case where thermal treatment is performed at 530° C. for 30 minutes. As shown in FIG. 13, the surface resistance in an as-deposited state of an in situ p-type doped poly$Si_{0.8}Ge_{0.2}$ layer having a smaller amount of Ge was about 120Ω/square, and the surface resistance in an as-deposited state of an in situ p-type doped poly$Si_{0.5}Ge_{0.5}$ layer having a larger amount of Ge was about 60Ω/square. Accordingly, it was evaluated that the larger the amount of Ge, the larger the surface resistance.

The surface resistance of the in situ p-type doped poly$Si_{0.8}Ge_{0.2}$ layer was reduced by 100Ω/square after activation thermal treatment. However, the surface resistance of the in situ p-type doped poly$Si_{0.5}Ge_{0.5}$ layer was only slightly reduced. Accordingly, even though the in situ p-type doped poly$Si_{0.5}Ge_{0.5}$ layer was deposited at 425° C., the in situ p-type doped poly$Si_{0.5}Ge_{0.5}$ layer can have surface resistance similar to the in situ p-type doped poly$Si_{0.5}Ge_{0.5}$ layer that was activated and thermally treated. It can be evaluated that both deposition and activation were attained at a low temperature.

Figure 14:
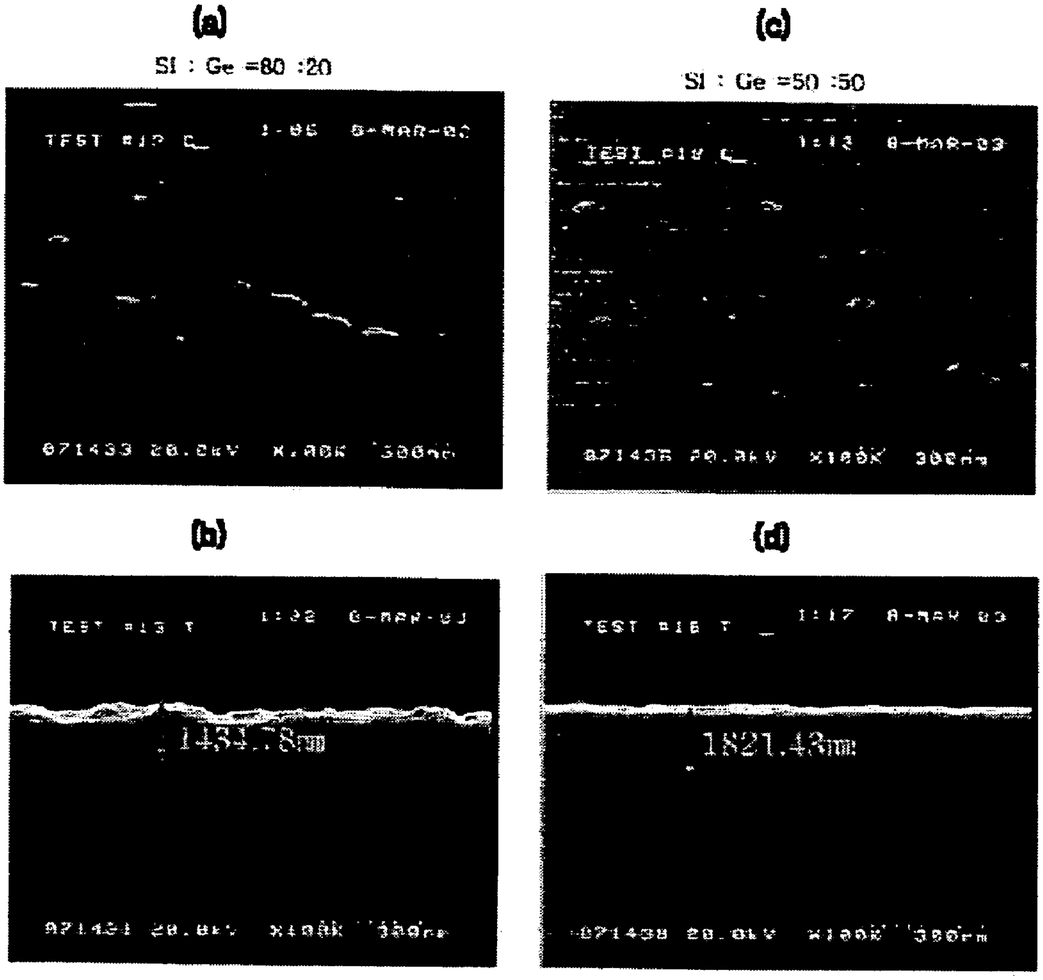
FIG. 14 is a scanning electron microscope (SEM) photo showing in situ p-type doped poly$Si_{0.8}Ge_{0.2}$ and poly$Si_{0.5}Ge_{0.5}$ deposited on a dielectric layer at 425° C. and thermally treated at 530° C. for 30 minutes according to some embodiments of the present invention.

FIG. 14 is a scanning electron microscope (SEM) photo showing in situ p-type doped poly$Si_{0.8}Ge_{0.2}$ and poly$Si_{0.5}Ge_{0.5}$ that were deposited at 425° C. and thermally treated at 530° C. for 30 minutes. (a) and (b) of FIG. 14 respectively represent the surface and cross-section of the in situ p-type doped poly$Si_{0.8}Ge_{0.2}$. (c) and (d) of FIG. 14 respectively represent the surface and cross-section of the in situ p-type doped poly$Si_{0.5}Ge_{0.5}$. As shown in FIG. 14, both the in situ p-type doped poly$Si_{0.8}Ge_{0.2}$ and poly$Si_{0.5}Ge_{0.5}$ have good surface morphology, and in particular, the in situ p-type doped poly$Si_{0.5}Ge_{0.5}$ has a more even and better surface morphology.

According to some embodiments of the present invention, a metallic layer, such as a TiN layer, and a doped poly$Si_{1-x}Ge_x$ layer are stacked, thereby forming an upper electrode. In some embodiments, the doped poly$Si_{1-x}Ge_x$ layer can be deposited at a low temperature of less than or about 550° C. in an activated state or can be activated at a temperature of less than or about 550° C., such that in comparison to a capacitor process that is performed at a high temperature of more than 600° C., a leakage current can be decreased.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating a capacitor of a semiconductor device, the method comprising:

forming a capacitor lower electrode on a semiconductor substrate;

forming a dielectric layer on the lower electrode; and sequentially stacking a metallic layer and a poly$Si_{1-x}Ge_x$ layer on the dielectric layer to form an upper electrode comprising the metallic layer and the polySi$_{1-x}$Ge$_x$ layer, wherein the polySi$_{1-x}$Ge$_x$ layer is formed at about 550° C. or less.

2. The method of claim 1 wherein the polySi$_{1-x}$Ge$_x$ layer comprises a doped polySi$_{1-x}$Ge$_x$ layer.

3. The method of claim 2, wherein the doped polySi$_{1-x}$Ge$_x$ layer is formed by doping a polySi$_{1-x}$Ge$_x$ layer with P or As.

4. The method of claim 2, wherein the doped polySi$_{1-x}$Ge$_x$ layer is formed by doping a polySi$_{1-x}$Ge$_x$ layer with B.

5. The method of claim 2, wherein the doped polySi$_{1-x}$Ge$_x$ layer is formed by depositing a polySi$_{1-x}$Ge$_x$ layer while simultaneously doping impurities.

6. The method of claim 2, wherein the doped polySi$_{1-x}$Ge$_x$ layer is deposited and simultaneously activated.

7. The method of claim 6, wherein the doped polySi$_{1-x}$Ge$_x$ is deposited and simultaneously activated between about 350° C. and about 550° C.

8. The method of claim 2, wherein the doped polySi$_{1-x}$Ge$_x$ layer is deposited and then activation and thermal treatment is performed.

9. The method of claim 8, wherein activation and thermal treatment is performed between about 400° C. and about 550° C.

10. The method of claim 2, wherein the doped polySi$_{1-x}$Ge$_x$ layer is formed using low pressure chemical vapor deposition (LP CVD) using furnace type equipment, single wafer type equipment, and/or mini-batch equipment.

11. The method of claim 1, wherein the metallic layer of the upper electrode comprises TiN, WN, TaN, Cu, W, Al, noble metals, oxide of the noble metals, and/or combinations thereof.

12. The method of claim 1, wherein the lower electrode comprises a metallic layer.

13. The method of claim 1 wherein x is between 0.1 and 0.9.

14. The method of claim 1 wherein x is between 0.1 and 0.6.

15. A method of fabricating a capacitor of a semiconductor device, the method comprising:

forming a capacitor lower electrode on a semiconductor substrate;

forming a dielectric layer on the lower electrode; and forming an Si$_{1-x}$Ge$_x$ layer on the dielectric layer at about 550° C. or less.

16. A method according to claim 15, further comprising:

thermally treating the Si$_{1-x}$Ge$_x$ layer at about 550° C. or less.

17. A method according to claim 15 wherein the following is performed between forming a dielectric layer and forming an Si$_{1-x}$Gelayer:

forming a metallic layer on the dielectric layer; and wherein forming an Si$_{1-x}$Ge$_x$ layer comprises forming an Si$_{1-x}$Ge$_x$ layer on the metallic layer at about 550° C. or less.

18. A method according to claim 15 wherein the Si$_{1-x}$Ge$_x$ layer comprises a polySi$_{1-x}$Ge$_x$ layer.

19. A method according to claim 15 wherein the lower electrode comprises a metallic layer.

20. A method according to claim 15 wherein x is between 0.1 and 0.9.

21. A method according to claim 15 wherein x is between 0.1 and 0.6.

* * * * *